United States Patent
Liu et al.

(10) Patent No.: US 9,538,673 B2
(45) Date of Patent: Jan. 3, 2017

(54) ELECTRONIC DEVICE AND METHOD FOR MANUFACTURING HOUSING FOR SAME

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Shyan-Juh Liu, New Taipei (TW); Kar-Wai Hon, New Taipei (TW); Sha-Sha Liu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 29 days.

(21) Appl. No.: 14/446,503

(22) Filed: Jul. 30, 2014

(65) Prior Publication Data

US 2015/0036295 A1    Feb. 5, 2015

(30) Foreign Application Priority Data

Jul. 30, 2013    (CN) .......................... 2013 1 0324648

(51) Int. Cl.
| | | |
|---|---|---|
| *H05K 7/20* | (2006.01) | |
| *H05K 5/02* | (2006.01) | |
| *G06F 1/20* | (2006.01) | |

(52) U.S. Cl.
CPC ............... *H05K 5/0213* (2013.01); *G06F 1/20* (2013.01); *H05K 7/20409* (2013.01)

(58) Field of Classification Search
CPC ... C09D 163/00; C08K 2201/011; G06F 1/20; H05K 7/20409
See application file for complete search history.

(56) References Cited

U.S. PATENT DOCUMENTS

| | | | |
|---|---|---|---|
| 2007/0207619 A1 | 9/2007 | Yoo et al. | |
| 2010/0282455 A1* | 11/2010 | Maegawa | B01D 53/265 165/181 |
| 2013/0058039 A1* | 3/2013 | Lee | H04M 1/03 361/690 |

FOREIGN PATENT DOCUMENTS

| | | |
|---|---|---|
| CN | 1540714 A | 10/2004 |
| CN | 101654221 A | 2/2010 |
| TW | M375238 | 3/2010 |
| TW | I384932 | 2/2013 |

OTHER PUBLICATIONS

Tao Xu "Periodic Holes with 10nm Diameter Produced by Grazing Ar+ Milling of the Barrier in Hexagonally Ordered Nanoporous Alumina" 2002 vol. 2, No. 1, 37-41.*

* cited by examiner

*Primary Examiner* — Robert J Hoffberg
*Assistant Examiner* — Hung Dang
(74) *Attorney, Agent, or Firm* — Zhigang Ma

(57) ABSTRACT

An electronic device includes a housing, a mother board received in the housing, and a plurality of heat-generating members received in the housing. A dissipation area is formed in the housing, and a plurality of dissipation holes are defined in an outer surface of the dissipation area. Each dissipation hole is in a nanometer scale. The disclosure also supplies a method for manufacturing a housing of the electronic device.

5 Claims, 5 Drawing Sheets

ELECTRONIC DEVICE AND METHOD FOR MANUFACTURING HOUSING FOR SAME

FIELD

The subject matter herein generally relates to electronic devices.

BACKGROUND

Electronic devices generate heat in use.

BRIEF DESCRIPTION OF THE DRAWINGS

Implementations of the present technology will now be described, by way of example only, with reference to the attached figures.

DETAILED DESCRIPTION

Figure 1:
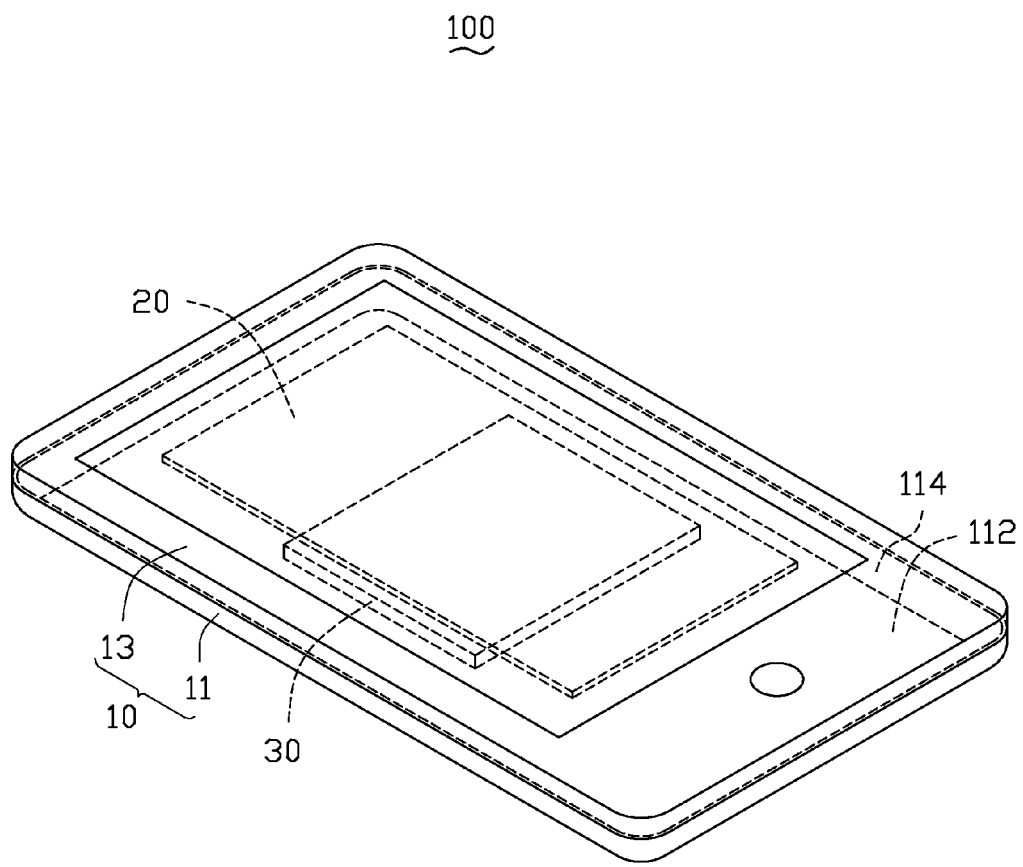
FIG. 1 is an assembled, isometric view of a first embodiment of an electronic device including a housing.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

An electronic device includes a housing, a mother board received in the housing, and a plurality of heat-generating members received in the housing. A dissipation area is formed in the housing, and a plurality of dissipation holes are defined in an outer surface of the dissipation area. A diameter of each dissipation hole is in a nanometer scale.

FIG. 1 illustrates an electronic device 100 of a first embodiment. The electronic device 100 can be a mobile phone, or a pad, or others. The electronic device 100 can include a housing 10, a mother board 20, and a battery 30. The mother board 20 and a battery 30 are heat-generating members when the electronic device 100 in use. The electronic device 100 can include other functional modules, such as a display module, but not described here for simplify.

Figure 2:
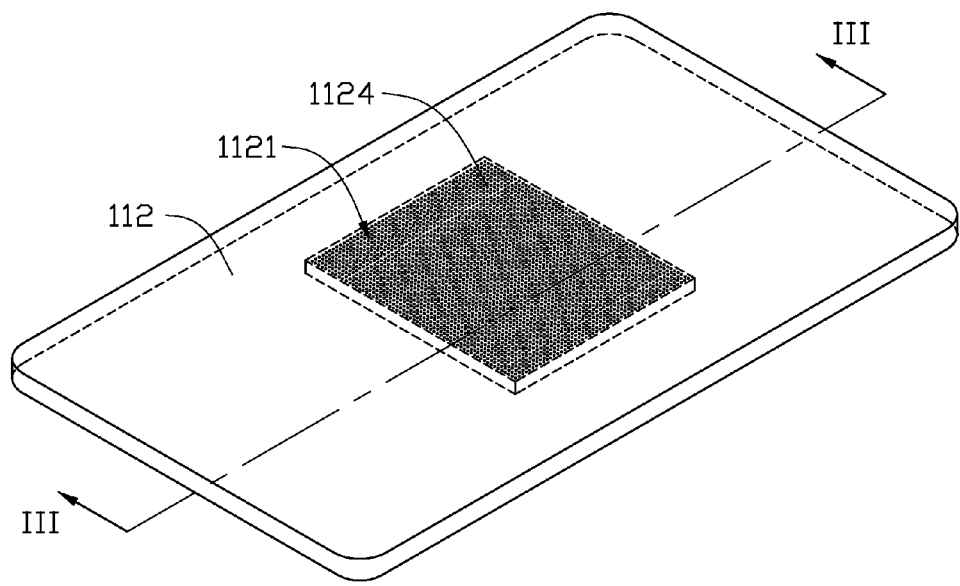
FIG. 2 is similar to FIG. 1, but viewed from another angle.
Figure 3:
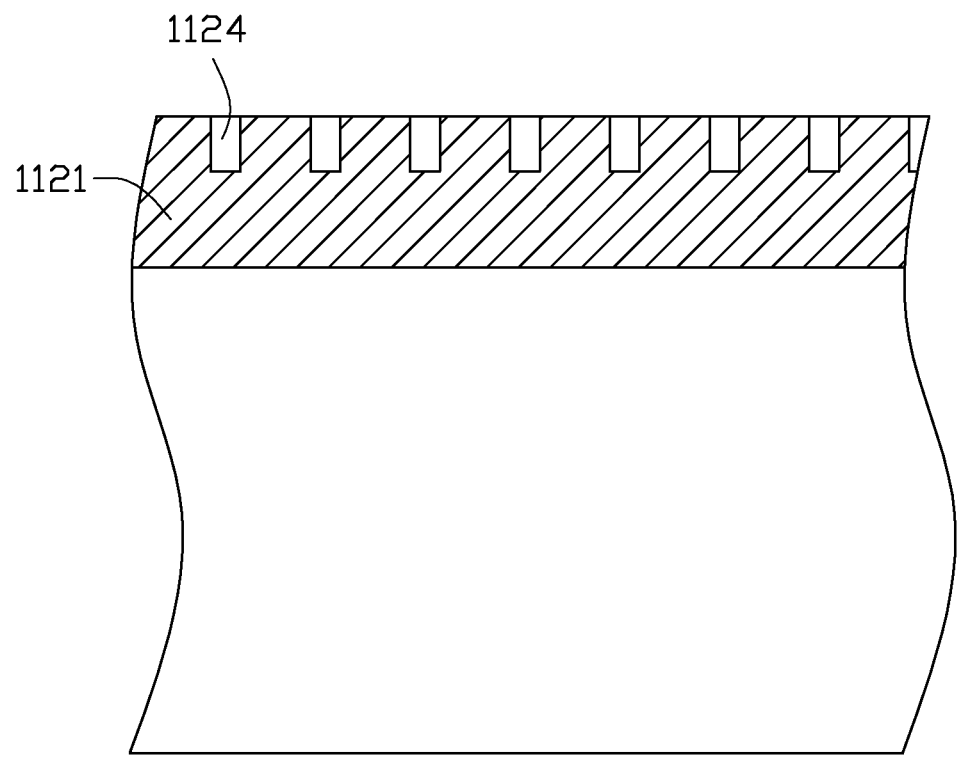
FIG. 3 is a partial cross-sectional view of the housing defining a plurality of dissipation holes of FIG. 2 taken along line III-III.
Figure 4:
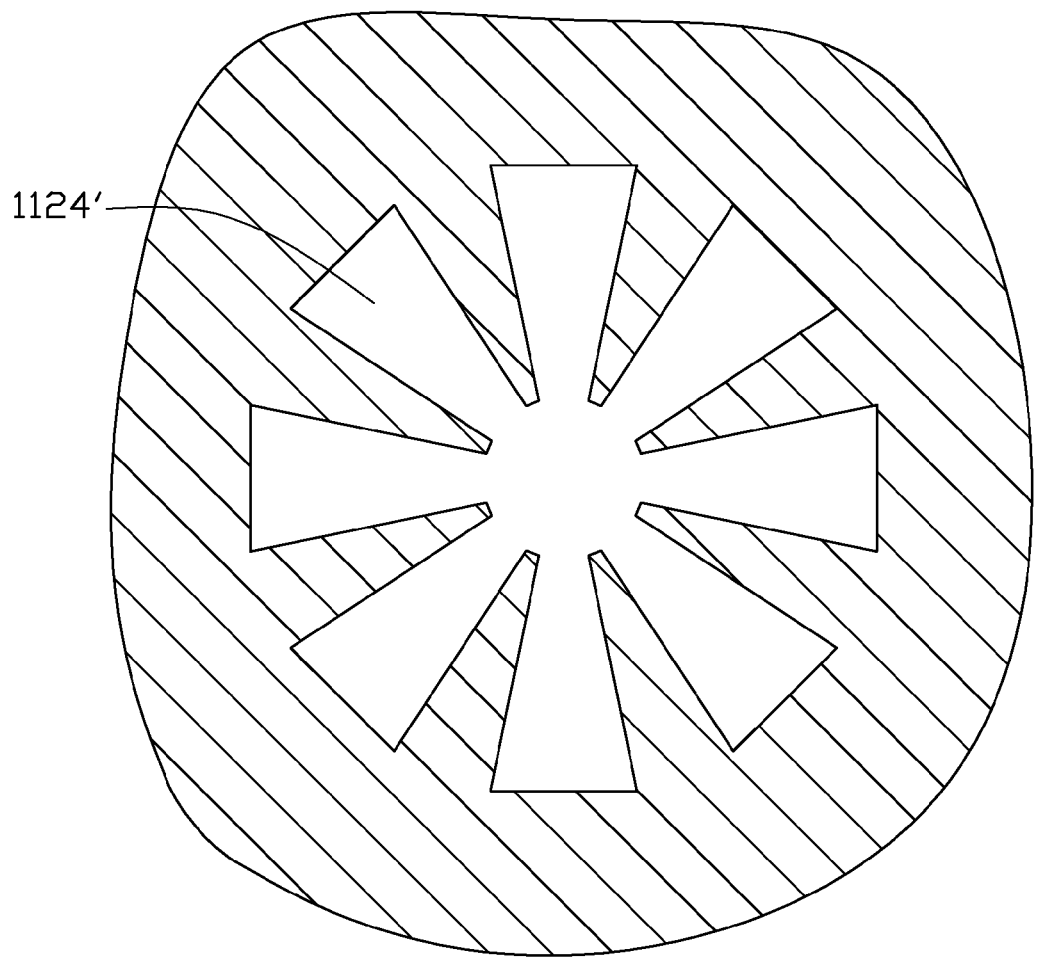
FIG. 4 is a cross-sectional view of a dissipation hole of an electronic device of a second embodiment.

The housing 10 can include a bottom case 11 and a top cover 13. The bottom case 11 can be substantially rectangular, and can be made of aluminum alloy. The bottom case 11 can include a bottom wall 112 and a periphery wall 114 intergraded formed with the bottom wall 112. The periphery wall 114 can extend from edges of the bottom wall 112 toward a same side of the bottom wall 112. The top cover 13 can be positioned on the periphery wall 114. The top cover 13 and the bottom case 11 cooperative can form a receiving space (not shown) for receiving the functional modules. The bottom wall 112 can include a dissipation area 1121. FIGS. 2 and 3 illustrate a plurality of dissipation holes 1124 can be defined in an outer surface of the dissipation area 1121. The dissipation holes 1124 can be arranged in matrix and can be distributed evenly in the dissipation area 1121. The dissipation holes 1124 can be blind holes, which extend along a direction substantially perpendicular to the bottom wall 112. A diameter of each dissipation hole 1124 can be in a range from about 10 to 100 nanometers. The diameter of each dissipation hole 1124 to a depth of each dissipation hole 1124 can be in a range from about 1:2 to about 1:10000. The cross-sectional shape of the dissipation hole 1124 along a direction substantially perpendicular to an axis of the dissipation hole can be in a circular shape.

The battery 20 and the mother board 30 can be fixed in the receiving space with some fixing structures (not shown), and can be electrically coupled each other. The battery 30 can be positioned adjacent to the bottom wall 112 and face with the dissipation area 1121.

The dissipation holes 1124 can act as heat sinks when the electronic device 100 is in use, because a specific surface of each dissipation hole 1124 is relative large.

In other embodiments, the dissipation area 1121 can be positioned with other heat generating members, such as a central processing unit. Positions of the heating generating members can deviate from the dissipation area 1121, when the heating generating members are interference with other structures of the electronic device 100. The dissipation area 1121 can be also formed in the top cover 13 corresponding to the heat-generating members. The number of the dissipation area 1121 is not limited to one, it can be two, or more. The cross-sectional shape of each dissipation 1124 along a direction substantially perpendicular to an axis of the dissipation hole of each dissipation hole 1124 can also be in other shapes, such as polygon. FIG. 2 illustrates a cross-sectional shape of each dissipation hole 1124' along a direction substantially perpendicular to an axis of the dissipation hole. The cross-sectional shape can include a plurality of echelons protruding from an edge of a circular.

Figure 5:
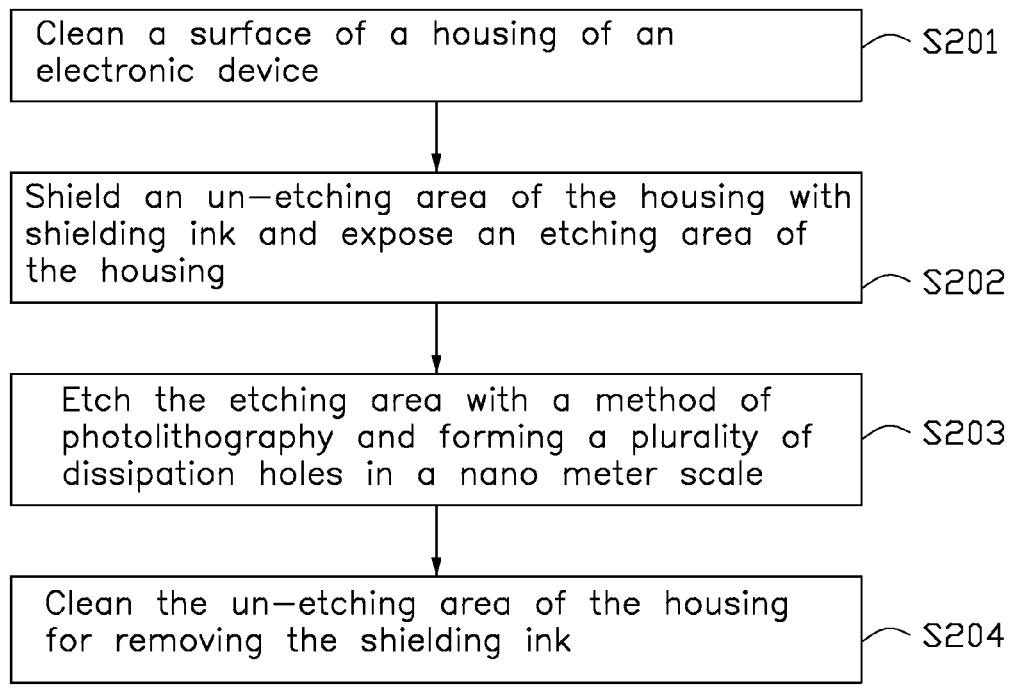
FIG. 5 is a flowchart of a method for manufacturing the housing of electronic device of FIG. 1.

FIG. 5 illustrates a process and method for manufacturing a housing of an electronic device.

In block 201, a housing of an electronic device can be cleaned for removing bolts and impurities on the housing via washing, oil removing, polishing. In other embodiments, the block 201 can be omitted, when the housing is cleaned well.

In block 202, an un-etching area of the housing can be shielded via coating shielding ink and an etching area of the housing can be exposed. The etching area can be positioned towards the battery. In the illustrated embodiment, the shielding ink can be ultra violet curing ink or thermoset ink.

In block 203, the etching area can be etched with a method of photolithography and a plurality of dissipation holes in nanometer scale can be formed. In the illustrated embodiment, preset nano patterns can be formed in the housing with a method of nano imprint or nanosphere lithography, and the plurality of dissipation holes then can be formed with a method of chemical etching, or plasma etching, or reactive ion etchings, then plurality of dissipation holes with special shapes are formed. A diameter of each dissipation hole can between about 10 and 100 nanometers in size. The diameter of each dissipation hole to a depth of each dissipation hole can be in a range from about 1:2 to about 1:10000. The cross-sectional shape of the dissipation hole along a direction substantially perpendicular to an axis of the dissipation hole can be in a circular shape.

In block 204, the un-etching area of the housing can be cleaned for removing the shielding ink.

The embodiments shown and described above are only examples. Many details are often found in the art such as the other features of a vacuum generator. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An electronic device comprising:
   a housing;
   a mother board received in the housing, and
   a plurality of heat-generating members received in the housing; and
   wherein a dissipation area is formed in the housing for dissipating heat from the plurality of heat-generating members, and a plurality of dissipation holes are defined in an outer surface of the dissipation area, and each dissipation hole is in a nanometer scale, the plurality of dissipation holes are blind holes, the diameter of each dissipation hole to a depth of each dissipation hole is in a range from about 1:2 to about 1:10, the plurality of dissipation holes extend from the outer surface toward the plurality of heat-generating members, a cross-sectional shape of each dissipation hole is substantially perpendicular to an axis of the dissipation hole, and a plurality of echelon protrude from an edge of a substantially circular shape dissipation area.

2. The electronic device of claim 1, wherein the diameter of each dissipation hole is from about 10 to 100 nanometers.

3. The electronic device of claim 1, wherein the housing comprises a bottom case, the bottom case comprises a bottom wall, the plurality of dissipation areas are formed in the bottom wall, a depth of each dissipation hole to a thickness of the bottom wall is in a range from about 1:1000 to about 1:10000.

4. The electronic device of claim 1, wherein the plurality of dissipation holes are distributed evenly in the dissipation area.

5. An electronic device comprising:
   a housing;
   a mother board received in the housing, and
   a plurality of heat-generating members received in the housing; and
   wherein a dissipation area is formed in the housing, and a plurality of dissipation holes are defined in an outer surface of the dissipation area, and each dissipation hole is between about 10 and 100 nanometers in size, the plurality of dissipation holes extend from the outer surface toward the plurality of heat-generating members, a cross-sectional shape of each dissipation hole is substantially perpendicular to an axis of the dissipation hole, and a plurality of echelon protrude from an edge of a substantially circular shape dissipation area.

* * * * *